United States Patent
Micheloni et al.

(10) Patent No.: US 6,956,773 B2
(45) Date of Patent: Oct. 18, 2005

(54) CIRCUIT FOR PROGRAMMING A NON-VOLATILE MEMORY DEVICE WITH ADAPTIVE PROGRAM LOAD CONTROL

(75) Inventors: Rino Micheloni, Turate (IT); Roberto Ravasio, Carvico (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 26 days.

(21) Appl. No.: 10/706,306

(22) Filed: Nov. 12, 2003

(65) Prior Publication Data

US 2004/0145947 A1 Jul. 29, 2004

(30) Foreign Application Priority Data

Nov. 12, 2002 (IT) .................................... MI2002A2387

(51) Int. Cl.[7] .............................................. G11C 16/04

(52) U.S. Cl. ......................... 365/185.19; 365/185.04; 365/185.23

(58) Field of Search ...................... 365/185.19, 185.18, 365/185.04, 185.07, 185.09, 185.23, 189.09, 189.07; 711/161, 162; 320/128

(56) References Cited

U.S. PATENT DOCUMENTS

| | | | | |
|---|---|---|---|---|
| 6,225,783 B1 | * | 5/2001 | Nagano et al. | 320/128 |
| 6,539,461 B2 | * | 3/2003 | Suzuki et al. | 711/162 |
| 6,772,306 B2 | * | 8/2004 | Suzuki et al. | 711/162 |
| 2004/0015941 A1 | * | 1/2004 | Sekine | 717/168 |
| 2004/0246841 A1 | * | 12/2004 | Miyamoto | 369/47.28 |

* cited by examiner

Primary Examiner—Gene N. Auduong
(74) Attorney, Agent, or Firm—Lisa K. Jorgenson; Jose Gutman; Fleit, Kain, Gibbons, Gutman, Bongini & Bianco P.L.

(57) ABSTRACT

A circuit (115,145,150), for programming a non-volatile memory device (100) having a plurality of memory cells (105), includes a plurality of driving elements (115) each one for applying a program pulse to a selected memory cell to be programmed. The driving elements are suitable to be supplied by a power supply unit (120,125), and a control means (145,150) controls the driving elements (115). The control means (145,150) includes means (150,205) for determining a residual capacity of the power supply unit, and a selecting means (145) selectively enables the driving elements (115) according to the residual capacity. A method of programming, an integrated circuit, and a computer system are also disclosed.

24 Claims, 4 Drawing Sheets ically formed by a matrix of cells, each one consisting of a floating gate MOS transistor; the transistor is programmed injecting an electric charge into its floating gate; conversely, the transistor is erased discharging its floating gate. The electric charge in the floating gate of the transistor modifies its threshold voltage, so as to define different logic values.

CIRCUIT FOR PROGRAMMING A NON-VOLATILE MEMORY DEVICE WITH ADAPTIVE PROGRAM LOAD CONTROL

CROSS-REFERENCE TO RELATED APPLICATION

This application is based upon and claims priority from prior Italian Patent Application No. MI2002A002387, filed on Nov. 12, 2002, the entire disclosure of which is herein incorporated by reference.

BACKGROUND OF THE INVENTION

1. Field of the Invention

The present invention relates to a circuit for programming a non-volatile memory device.

2. Description of the Related Art

Non-volatile memory devices are commonly used for storing information that must be preserved even when a power supply feeding the memory device is off. A particular type of non-volatile memory device (such as a flash $E^2PROM$) is programmable electrically. A flash memory is typically formed by a matrix of cells, each one consisting of a floating gate MOS transistor; the transistor is programmed injecting an electric charge into its floating gate; conversely, the transistor is erased discharging its floating gate. The electric charge in the floating gate of the transistor modifies its threshold voltage, so as to define different logic values.

The writing of a block of data on selected memory cells is accomplished through a series of program steps, each one followed by a verification of the values actually stored in the memory cells. During the program step, a voltage pulse is applied to each memory cell that needs to be programmed (in order to cause the injection of electric charge into its floating gate); the program pulse is commonly applied through a driving element (referred to as program load), which is supplied by a charge pump.

Each memory cell absorbs a significant amount of current during the program step; therefore, the number of memory cells that can be programmed at the same time is limited by the capacity of the charge pump.

A solution known in the art for improving the speed of the writing operation is that of providing multiple banks of program loads. This structure allows more program steps to be carried out in succession without any interposed verification. Therefore, the corresponding time required for switching the flash memory (between a program mode and a reading mode of operation) is saved.

However, the problem of the constraint imposed by the capacity of the charge pump remains unresolved. In other words, in the flash memories known in the art it is not possible to improve the speed of the program step without either increasing the capacity of the charge pump or reducing the current absorbed by the memory cells.

Accordingly, there exists a need for overcoming the disadvantages of the prior art as discussed above.

SUMMARY OF THE INVENTION

It is an object of the present invention to overcome the above-mentioned drawbacks. In order to achieve this object, a circuit as set out in the claims is proposed.

Briefly, a preferred embodiment of the present invention provides a circuit for programming a non-volatile memory device having a plurality of memory cells, the circuit including a plurality of driving elements each one for applying a program pulse to a selected memory cell to be programmed, the driving elements being suitable to be supplied by a power supply unit, and control means for controlling the driving elements, wherein the control means includes means for determining a residual capacity of the power supply unit, and selecting means for selectively enabling the driving elements according to the residual capacity.

Moreover, embodiments of the present invention may provide a non-volatile memory device including this circuit; and a corresponding method of programming a non-volatile memory device is also encompassed.

BRIEF DESCRIPTION OF THE DRAWING

Further features and advantages of embodiments of the present invention will be made clear by the following description, given purely by way of a non-restrictive indication, with reference to the attached figures, in which:

FIG. 3b is a representation of a logic block included in the circuit of FIG. 3a.

DESCRIPTION OF THE PREFERRED EMBODIMENTS

Figure 1:
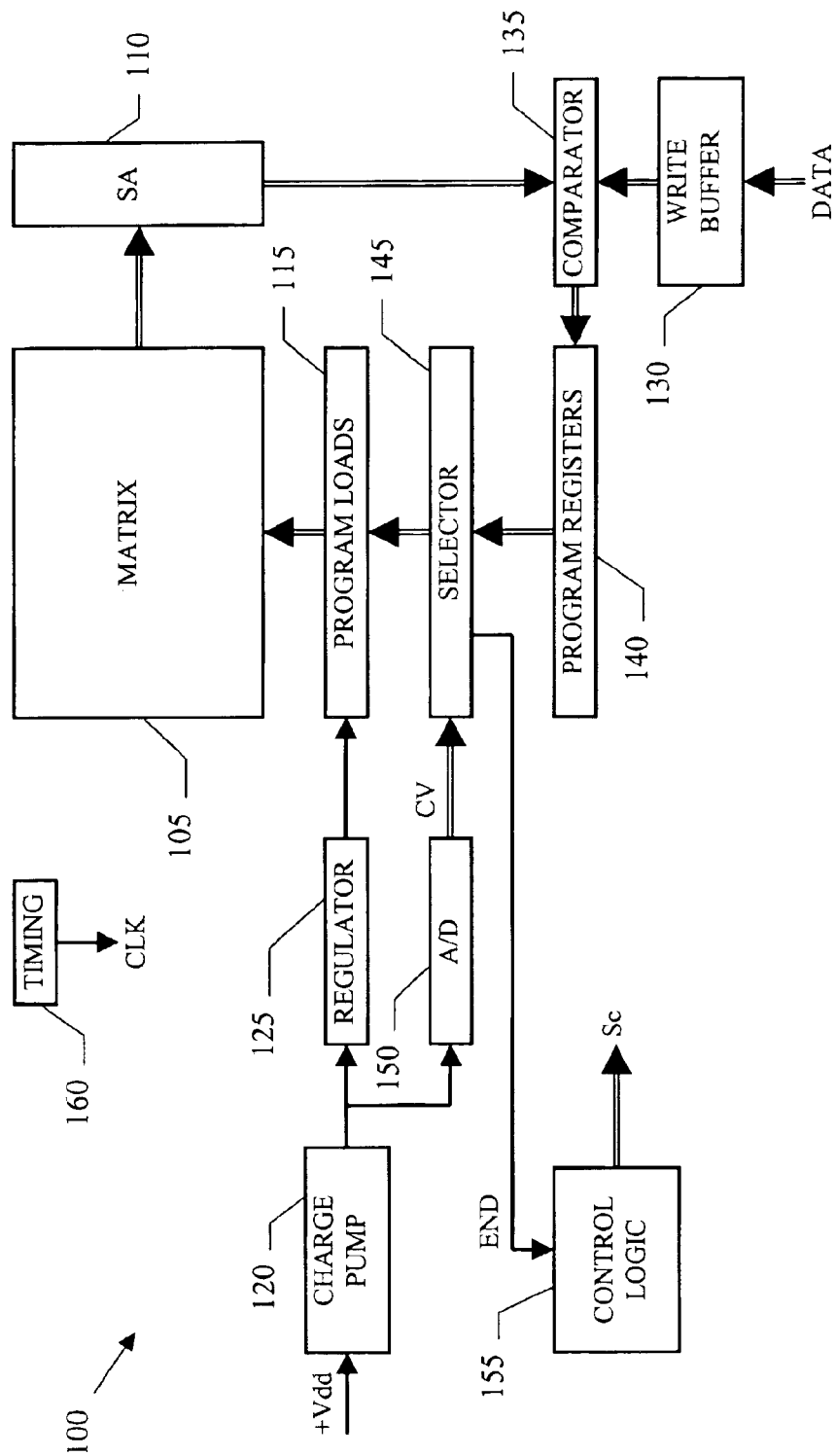
FIG. 1 is a schematic block diagram of a writing section of a non-volatile memory device in which the circuit of a preferred embodiment of the present invention can be used.

With reference in particular to FIG. 1, a writing section of a multilevel flash $E^2PROM$ 100 is illustrated. The flash 100 includes an array 105 of memory cells (for example, with a so-called NOR architecture). The matrix 105 further includes a column decoder and a row decoder, which are used to select the memory cells (such as 64) of a page consisting of 8 words that are simultaneously processed by the flash 100 (in response to a corresponding address).

Each memory cell consists of a floating gate MOS transistor. The memory cell in a non-programmed (or erased) condition features a low threshold voltage. The memory cell is programmed by injecting electric charge into its floating gate; the memory cell may be programmed to multiple levels, each one associated with a corresponding range of its threshold voltage. Each level represents a different logic value; for example, the flash 100 supports 4 levels so that each memory cell stores a value consisting of 2 bits of information (11, 10, 01 and 00 for increasing threshold voltages).

A bank of sense amplifiers 110 (64 in the example at issue) is used to read the values stored in the memory cells of a selected page. A bank of program loads 115 is instead used to program the memory cells of multiple selected pages; for example, the flash 100 includes 256 program loads (for programming the memory cells of 4 pages). Each program load 115 drives a memory cell; the program load 115 applies a program pulse providing sufficient energy to some of the electrons (hot electrons) flowing through a channel of the transistor to cause their injection into the floating gate. As a consequence, the threshold voltage of the memory cell is increased.

A charge pump 120 receives an external power supply voltage +Vdd (for example, 3V relative to a reference voltage or ground); the charge pump 120 generates an internal power supply voltage of higher value (for example, up to 8.5V). The internal power supply voltage is provided to a regulator 125, which maintains the internal power supply voltage substantially constant under changing load conditions. The regulator 125 directly supplies the program loads 115.

A buffer 130 latches a block of data (256×2 bits in the example at issue) to be written on the selected memory cells of the matrix (previously erased). A module 135 compares the values stored in the selected memory cells (read by the sense amplifiers 110 in succession) with the block of data (latched in the buffer 130). For each selected memory cell, the comparator 135 controls a flag PFi (with i=0 . . . 255) that is asserted when the memory cell requires a program pulse for approaching the value to be written (i.e., when the value stored in the memory cell is higher than the desired one); the program flags are stored in a bank of registers 140.

A module 145 accesses the registers 140. The module 145 also interfaces with an analog-to-digital (A/D) converter 150; the A/D converter 150 provides a signal CV indicative of the voltage currently generated by the charge pump 120. The module 145 operates as a selector for enabling the program loads 115; the selector 145 also generates a signal END, which is asserted as soon as a program step on the selected memory cells has been completed.

The signal END is provided to a control logic 155. The control logic 155 manages operation of the flash 100 by means of a sequence of control signals (denoted as a whole with Sc). A timing unit 160 provides a clock signal CLK, which is used to synchronize all the circuits of the flash 100.

A writing operation consists of a sequence of program steps and verify steps. Particularly, the block of data to be written on the selected memory cells is compared with the values that are currently stored, and the program flags are set accordingly. As described in detail in the following, a program pulse is then applied to the drain terminals of the memory cells to be programmed (while their gate terminals are kept at a predetermined voltage); the drain/gate voltage has a value such as to increase the threshold voltage of the memory cells of a small amount (for example, 300 mV). As soon as the program step has been completed (signal END asserted), the new content of the selected memory cells is compared again with the block of data to be written. The steps described above are repeated changing the voltage at the gate terminals of the memory cells (so as to approximate a trapezoidal wave shape providing a constant electric field at an oxide layer thereof). The writing operation is completed when all the selected memory cells reach the desired values (or the writing operation is aborted after a predetermined number of program steps); typically, a series of 8 program pulses are requested to reduce the value stored in each memory cell of one unit (from 11 to 10, from 10 to 01, or from 01 to 00).

The number of program loads 115 that can be enabled at the same time is limited by the capacity of the charge pump 120 (due to the current absorbed by the memory cells being programmed). For example, a charge pump supplying a maximum current of 5 mA cannot program more than about 64 memory cells.

The inventors have discovered that the structures known in the art do not exploit the capacity of the charge pump 120 at its best.

First of all, the current absorbed by each memory cell (to which the program pulse is applied) is not steady. In fact, the current decreases during the program step while the electric charge is injected into the floating gate of the transistor (and then its threshold voltage is increased).

Moreover, the charge pump 120 is dimensioned so as to ensure the correct operation of the flash 100 in the worst operative condition; for example, the charge pump 120 can supply the maximum required current (5 mA) even when the power supply voltage +Vdd is low (down to 2.7V) and when the environment temperature is high (up to 90° C.). Therefore, in a standard operative condition (power supply voltage +Vdd equal to 3V and environment temperature equal to 27° C.) the charge pump 120 can supply a higher current (for example, up to 7 mA).

At the end, the program pulses are applied only to a portion of the selected memory cells. In fact, at the beginning of the writing operation each memory cell stores the value 11 (having being erased). If the same value 11 must be written on the memory cell, no program pulse is required; one, two or three series of program pulses are instead required to write the values 10, 01 and 00, respectively. Assuming that the values to be written are uniformly distributed among the four possible values 00–11, it results that only 50% of the memory cells must be programmed on the average.

In sharp contrast to the solutions known in the art, the circuit described in the following monitors the actual load of the charge pump 120, so as to estimate a residual capacity thereof. At every clock signal, the program loads 115 are selectively enabled according to the residual capacity of the charge pump 120 (in addition to information about the selected memory cells to be programmed). In this way, the program loads 115 are enabled as soon as possible; in any case, the total current required to the charge pump 120 at any time never exceeds its capacity.

However, the concepts of the present invention are also applicable when the flash has a different architecture or is replaced with another (electrically programmable) non-volatile memory device (such as an $E^2PROM$), when each memory cell stores a different number of bits (down to a single one) or is programmable to another number of levels (even different from a power of 2), when the memory cells are programmed with an alternative procedure, or when a different number of sense amplifiers and/or program loads is provided. Similar considerations apply if the flash has multiple banks of program loads (wherein more program steps are carried out in succession without any interposed verification), if the charge pump and the regulator are replaced with equivalent means, if the program registers store other information, if different means is used for monitoring the current load of the charge pump, and the like. Alternatively, the flash is also suitable to be programmed using an external power supply unit, which is coupled with the program loads through an alternative path; this procedure is typically used by a manufacturer for test purposes or it is available to a user for a fast programming of the flash.

Figure 2:
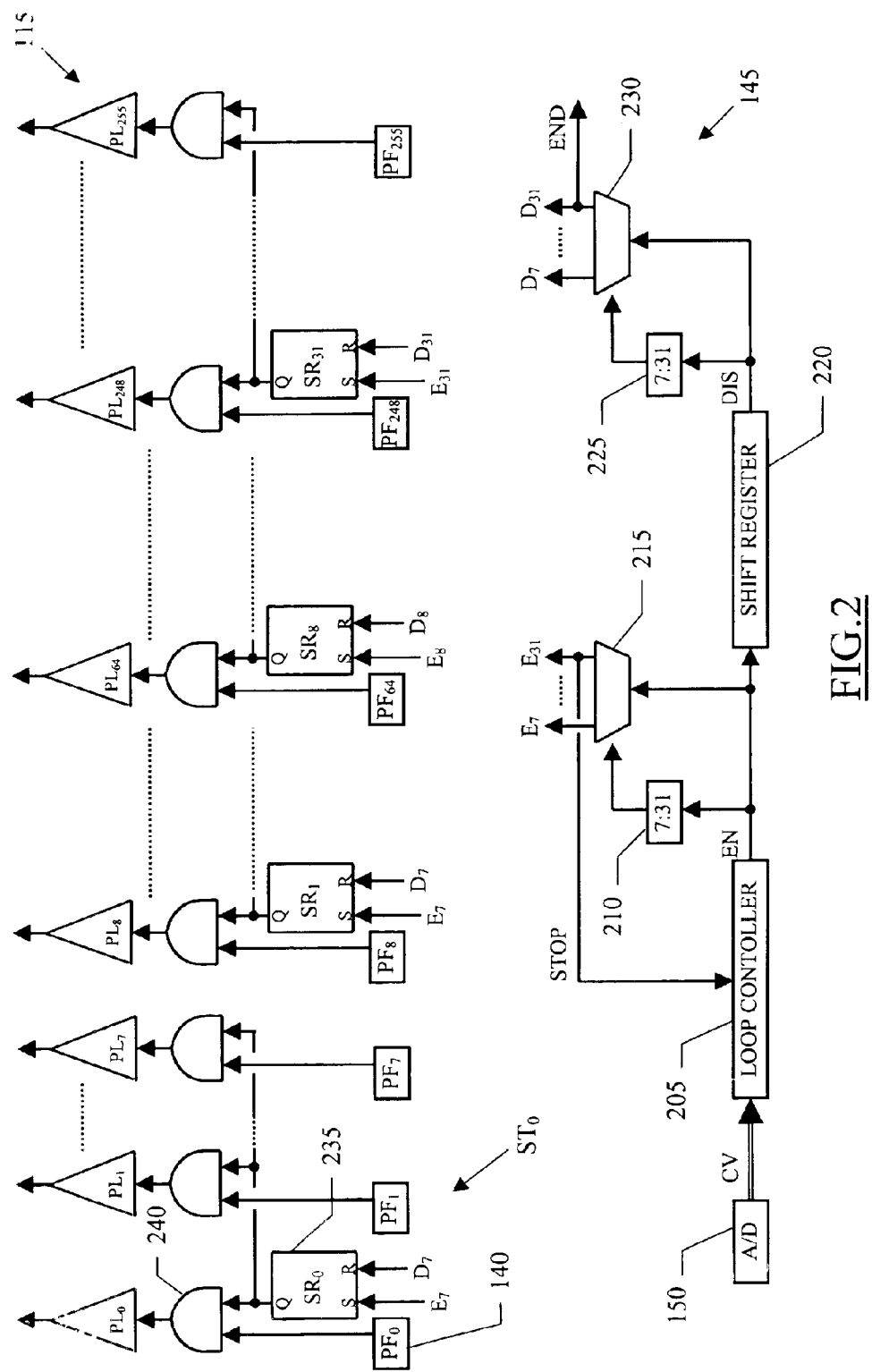
FIG. 2 shows a first embodiment of the circuit.

In a particular embodiment of the present invention, as shown in FIG. 2, the program loads 115 are grouped into multiple subsets; for example, the program loads (individually denoted with $PL_i$) are grouped into 32 subsets $ST_j$ (with j=0 . . . 31), each one of 8 program loads (from $ST_0=L_0-L_7$ to $ST_{31}=L_{248}-L_{255}$). Each subset of program loads $ST_j$ is individually enabled as soon as possible.

For this purpose, the signal CV output by the A/D converter 150 is supplied to a loop controller 205. The loop controller 205 generates a global enabling signal EN, which is asserted (at every clock signal) when the residual capacity of the charge pump allows the supplying of a further subset of program loads $ST_j$. For example, the loop controller 205 compares the signal CV with a predetermined threshold value; in a more sophisticated structure, the loop controller 205 implements an algorithm that estimates the position of the charge pump on its actual load line.

The global enabling signal EN is provided to a circuit 210 operating as a counter from 7 to 31, and to a demultiplexer 215 having 31−7=24 output terminals (each one providing a corresponding local enabling signal $E_7$–$E_{31}$). The starting number (7) is chosen so as to ensure that the charge pump can always supply the corresponding first subsets of program loads (from $ST_0$ to $ST_7$ in the example at issue), even in the worst operative condition. The number stored in the counter 210 controls the demultiplexer 215, thereby transferring the global enabling signal EN to the corresponding output terminal; in this way, the local enabling signals $E_7$–$E_{31}$ are asserted in succession every time the global enabling signal EN is asserted. The last local enabling signal $E_{31}$ also defines a suspend signal STOP, which is returned to the loop controller 205.

The global enabling signal EN is also provided to a shift register 220, which outputs a global disabling signal DIS after a predetermined delay. The delay of the shift register 220 is set to a value (for example, 15–30 clock periods) corresponding to the length of the program pulse.

The global disabling signal DIS is provided to a counter 225 (from 7 to 31) and to a demultiplexer 230 (having 24 output terminals each one providing a corresponding local disabling signal $D_7$–$D_{31}$). The number stored in the counter 225 controls the demultiplexer 230, so as to transfer the global disabling signal DIS to the corresponding output terminal. The last local disabling signal $D_{31}$ also defines the signal END (for the control logic of the flash).

The selector 145 further includes 32 SR latches 235; each latch (denoted with $SR_j$) is associated with a subset of program loads $ST_j$. The first 8 latches $SR_0$–$SR_7$ are controlled by the same local enabling signal $E_7$ and by the same local disabling signal $D_7$; particularly, all the latches $SR_0$–$SR_7$ receive the local enabling signal $E_7$ and the local disabling signal $D_7$ at their set terminals (S) and reset terminals (R), respectively. The local enabling signals $E_8$–$E_{31}$ and the local disabling signals $D_8$–$D_{31}$ are applied to the set terminals and to the reset terminals, respectively, of each one of the remaining latches $SR_8$–$SR_{31}$.

For each program load $PL_i$ of a generic subset $ST_j$, the value provided by a main output terminal (Q) of the latch $SR_j$ and the program flag $PF_i$ (stored in the associated register 140) are applied to respective input terminals of an AND gate 240. The signal output by the AND gate 240 directly controls the program load $PL_i$.

At the beginning of a program step all the latches $SR_j$ are in a reset state, and both the counters 210 and 225 store the last number 31. As soon as the control logic enables the loop controller 205, the global enabling signal EN is asserted (since the charge pump always has a sufficient residual capacity). The counter 210 then switches to the starting number 7, so as to assert the local enabling signal $E_7$; in response thereto, the first 8 latches $SR_0$–$SR_7$ are set. As a consequence, all the program loads of the subsets $ST_0$–$ST_7$ associated with the memory cells to be programmed (program flags $PF_i$ asserted) are enabled thereby applying a program pulse to the corresponding memory cells.

At the next clock signal, the A/D converter 150 detects the current voltage of the charge pump again. If the loop controller 205 determines that the residual capacity of the charge pump allows the supplying of a further subset of program loads $ST_j$, the global enabling signal EN is asserted. The counter 210 is incremented (to the number 8), so as to assert the local enabling signal $E_8$ and then to set the latch $SR_8$. As a consequence, all the program loads of the subset $ST_8$ associated with memory cells to be programmed are enabled. Conversely, if the limit defined by the capacity of the charge pump has been reached the global enabling signal EN is de-asserted; therefore, no further subset of program loads $ST_j$ is enabled. The same operations described above are continually repeated at every clock signal.

In the meanwhile, the global enabling signal EN goes through the shift register 220. The global disabling signal DIS is asserted after the corresponding delay from the assertion of the local enabling signal $E_7$. The counter 225 then switches to the starting number 7, so as to assert the local disabling signal $D_7$; in response thereto, the first 8 latches $SR_0$–$SR_7$ are reset. As a consequence, all the program loads of the subsets $ST_0$–$ST_7$ are disabled. In this way, the load of the charge pump is reduced allowing the enabling of further subsets of program loads $ST_j$ (if necessary). Likewise, the global disabling signal DIS is asserted again after the same delay from the assertion of every next local enabling signal $E_j$. The counter 225 is then incremented in succession, so as to assert the corresponding local disabling signal $D_j$ (thereby resetting the latch $SR_j$ and disabling the subset of program loads $ST_j$).

As soon as the last subset of program loads $ST_{31}$ has been enabled (signal $E_{31}$ asserted), the signal STOP is asserted; in response thereto, the loop controller 205 is disabled. After the delay defined by the shift register 220, the same subset of program loads $ST_{31}$ is disabled (signal $D_{31}$ asserted). As a consequence, the signal END is asserted as well (for signaling the completion of the program step to the control logic of the flash).

However, the concepts of the present invention are also applicable when the program loads are grouped into a different number of subsets, when the residual capacity of the charge pump is determined in another way, or when equivalent means is provided for controlling the program loads. Similar considerations apply if a different number of subsets are simultaneously enabled at the beginning of the program step, if the shift register provides a different delay or it is replaced with equivalent means, and the like.

Figure 3A:
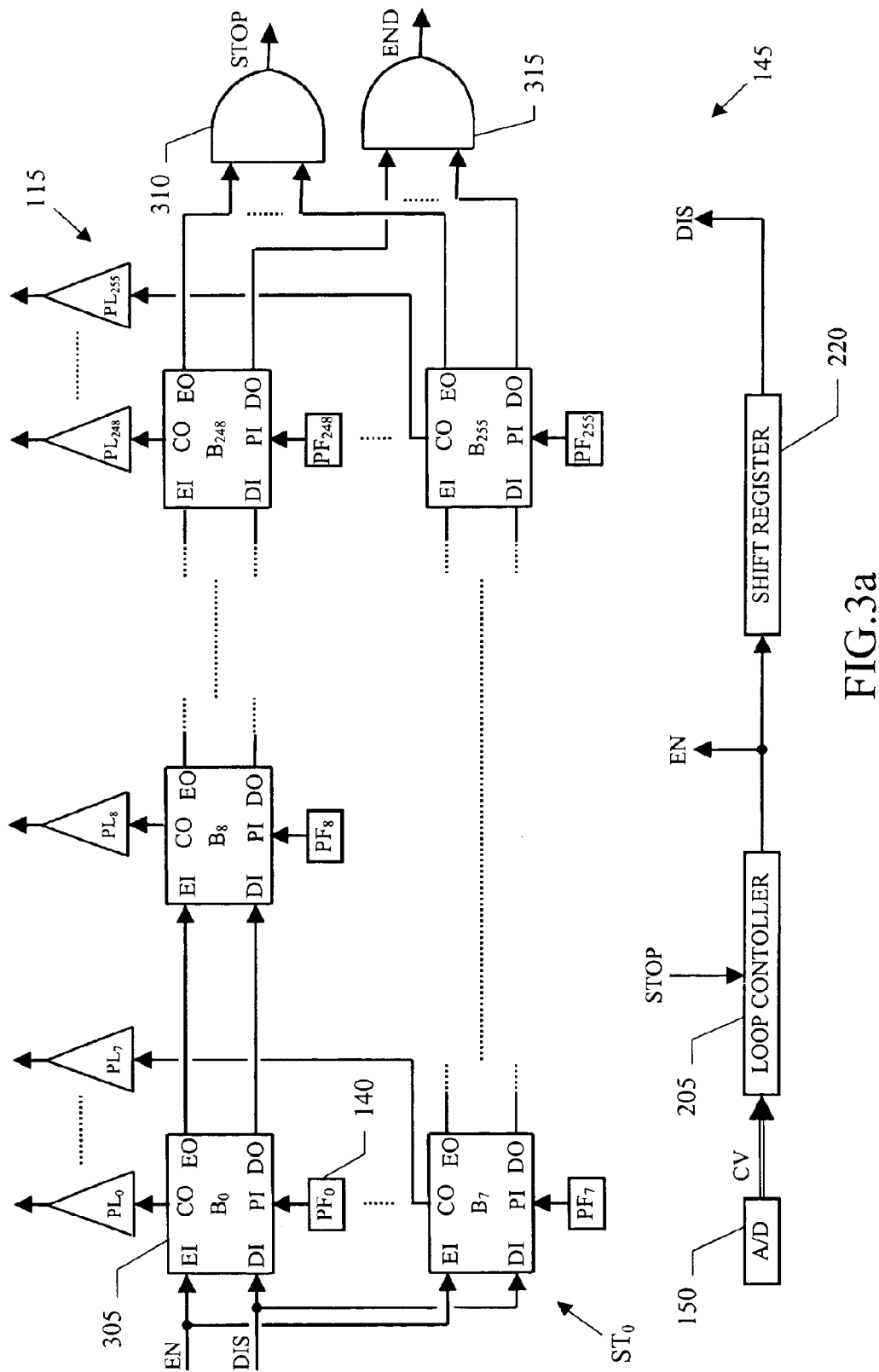
FIG. 3a shows a different embodiment of the circuit.

A further embodiment of the present invention is illustrated in FIG. 3a (the elements corresponding to the ones shown in FIG. 2 are denoted with the same references and their explanation is omitted for the sake of simplicity); in this case, the selector only takes into consideration the program loads associated with memory cells actually to be programmed.

For this purpose, the selector 145 includes a matrix of logic blocks 305; each logic block (denoted with $B_i$) is associated with a program load $PL_i$. The logic block $B_i$ has an enabling input terminal EI, a disabling input terminal DI and a program flag input terminal PI; the logic block $B_i$ also has an enabling output terminal EO, a disabling output terminal DO and a control output terminal CO.

Each program flag $PF_i$ (stored in the associated register 140) is supplied to the input terminal PI of the block $B_i$; the signal provided by the output terminal CO directly controls the associated program load $PL_i$. All the blocks $B_0$–$B_7$ of the first subset $ST_0$ receive the global enabling signal EN and the global disabling signal DIS at their input terminals EI and at their input terminals DI, respectively. The input terminal EI and the input terminal DI of each one of the other blocks $B_i$ are connected to the output terminal EO and to the output terminal DO, respectively, of the corresponding block of the previous subset $ST_j$ (for example, the block $B_0$ is cascade connected to the block $B_8$, which in turn is connected to the block $B_{16}$, and so on until the block $B_{248}$); in this way, the blocks $B_i$ result logically arranged into 8 parallel channels. The signals provided by the output terminals EO of all the blocks $B_{248}$–$B_{255}$ of the last subset $ST_{31}$ are applied to respective input terminals of an AND gate 310; the AND gate 310 outputs the signal STOP, which is returned to the loop controller 205. The signals provided by the output terminals DO of the same blocks $B_{248}$–$B_{255}$ are likewise applied to respective input terminals of a further AND gate 315; the AND gate 315 outputs the signal END (for the control logic of the flash).

Figure 3B:
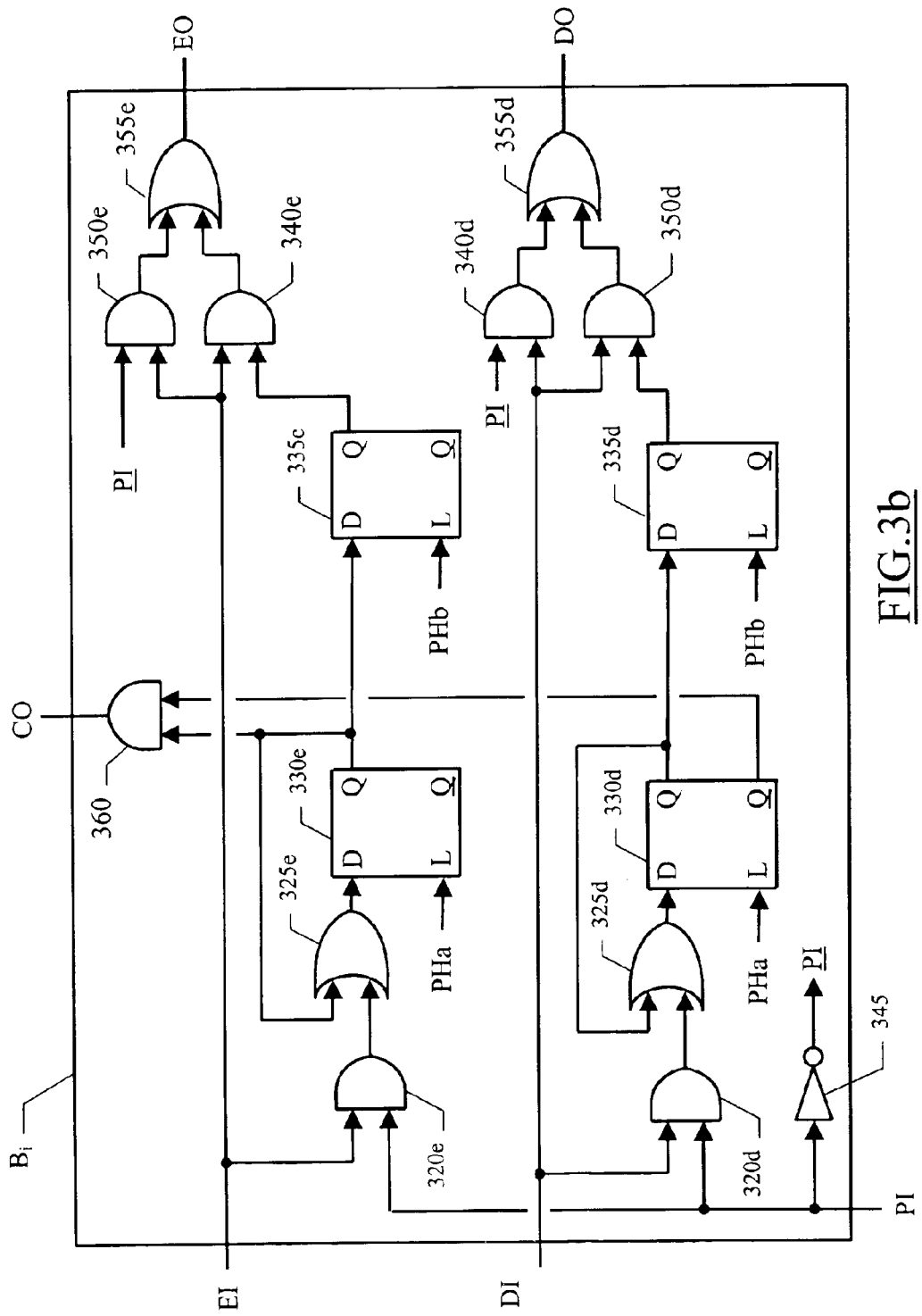

The structure of a generic block $B_i$ is illustrated in FIG. 3b. The block $B_i$ consists of two legs for enabling and for disabling, respectively, the associated program load.

Particularly, the signal at the input terminal EI and the signal at the input terminal PI are AND-ed by a logic gate 320e. An OR gate 325e receives (at respective input terminals) the signal provided by the AND gate 320e and the signal provided by a main output terminal (Q) of a D latch 330e. The output terminal of the OR gate 325e is connected to a set terminal (D) of the latch 330e. An enabling terminal (L) of the latch 330e receives a control signal PHa, which is generated applying a predetermined phase displacement to the clock signal CLK. The signal provided by the main output terminal of the latch 330e is also applied to the set terminal of a further D latch 335e; the enabling terminal of the latch 330e receives a different control signal PHb, which is generated applying a further phase displacement to the control signal PHa; the control signals PHa and PHb are disoverlapped, so that they are never asserted at the same time. The signal at the main output terminal of the latch 335e and the signal at the input terminal EI are AND-ed by a logic gate 340e; a further AND gate 350e is supplied with the same signal at the input terminal EI and with a signal $\overline{PI}$, which is output by an inverter 345 connected to the input terminal PI. The signal provided by the AND gate 340e and the signal provided by the AND gate 350e are applied to respective input terminals of an OR gate 355e; the output terminal of the OR gate 355e is directly connected to the output terminal EO.

The disabling leg of the block $B_i$ processes the signal at the input terminal DI in a similar manner. The elements of the disabling leg are denoted with the same references of the corresponding elements in the enabling leg, simply replacing the suffix "d" for the suffix "e". The structure of the disabling leg is exactly the same as the one of the enabling leg, so that its explanation is omitted for the sake of simplicity.

The signal at the main output terminal of the latch 330e and the signal at an inverted output terminal ($\overline{Q}$) of the latch 330d are supplied to an AND gate 360. The output terminal of the AND gate 360 is directly connected to the output terminal CO.

In a rest condition, all the latches 330e, 335e, 330d and 335d are reset (in response to the completion of a previous program step); therefore, the signals at the output terminals EO, DO and CO are de-asserted. Let us assume now that the signal at the input terminal EI is asserted at a generic clock signal.

If the corresponding memory cell is to be programmed, the signal at the input terminal PI is asserted and the inverted signal $\overline{PI}$ is de-asserted. In this case, the signal at the output terminal EO remains de-asserted (irrespective of the signal at the input terminal EI). The signal at the set terminal of the latch 330e is instead asserted. After a delay defined by the phase displacement of the control signal PHa, the latch 330e is then set. This results in the assertion of the signal at the output terminal CO. After a further delay defined by the phase displacement of the control signal PHb, the latch 335e is set as well. From now on, the signal at the set terminal of the latch 330e is always asserted (irrespective of the signal at the input terminal EI); as a consequence, the latch 330e remains set. The signal at the output terminal EO is instead asserted or de-asserted according to the signal at the input terminal EI.

Conversely, if the corresponding memory cell is not to be programmed the signal at the input terminal PI is de-asserted and the inverted signal $\overline{PI}$ is asserted. The latches 330e and 335e then remain reset (irrespective of the signal at the input terminal EI); as a consequence, the signal at the output terminal CO is always de-asserted. In this case, however, the signal at the output terminal EO is asserted or de-asserted (at every clock signal) according to the signal at the input terminal EI.

In a similar manner, let us assume that the signal at the input terminal DI is asserted at a generic clock signal.

If the corresponding memory cell has been programmed, the signal at the input terminal PI is asserted and the inverted signal $\overline{PI}$ is de-asserted. In this case, the signal at the output terminal DO remains de-asserted (irrespective of the signal at the input terminal DI). The signal at the set terminal of the latch 330d is instead asserted. After a delay defined by the phase displacement of the control signal PHa, the latch 330d is then set. This results in the de-assertion of the signal at the output terminal CO. After a further delay defined by the phase displacement of the control signal PHb, the latch 335d is set as well. From now on, the signal at the set terminal of the latch 330d is always asserted (irrespective of the signal at the input terminal DI); as a consequence, the latch 330d remains set. The signal at the output terminal DO is instead asserted or de-asserted according to the signal at the input terminal DI.

Conversely, if the corresponding memory cell has not been programmed the signal at the input terminal PI is de-asserted and the inverted signal $\overline{PI}$ is asserted. The latches 330d and 335d then remain reset (irrespective of the signal at the input terminal DI); as a consequence, the signal at the output terminal CO is not affected by the signal at the input terminal DI. In this case, however, the signal at the output terminal DO is asserted or de-asserted (at every clock signal) according to the signal at the input terminal DI.

In other words, the signal applied to the input terminal EI and the signal applied to the input terminal DI of the block $B_i$ are managed as tokens (which are either used when necessary or passed to the next block otherwise).

Referring back to FIG. 3a, at the beginning of a program step the signals at the output terminals CO of all the blocks $B_i$ are de-asserted. As soon as the control logic enables the loop controller 205, the global enabling signal EN is asserted. The global enabling signal EN is supplied to the input terminals EI of the first blocks $B_0$–$B_7$ in all the channels. For each channel, if the first block is associated with a memory cell to be programmed (signal at the input terminal PI asserted) the signal at the output terminal CO is asserted (so as to enable the corresponding program load), while the signal at the output terminal EO remains de-asserted. On the contrary (signal at the input terminal PI de-asserted), the signal at the output terminal EO is asserted (so as to pass the global enabling signal EN to the next corresponding block), while the signal at the output terminal CO remains de-asserted. The same operations described above are executed until a block associated with a memory cell to be programmed is reached.

At the next clock signal, the A/D converter 150 detects the current voltage of the charge pump again. If the loop controller 205 determines that the residual capacity of the charge pump allows the supplying of a further subset of program loads $ST_j$, the global enabling signal EN is asserted. For each channel, the global enabling signal EN goes through all the blocks that are associated with either a memory cell not to be programmed or a program load already enabled (until a block associated with a memory cell still to be programmed is reached); when the global enabling signal EN crosses the whole channel, the signal at the corresponding input terminal of the AND gate 310 is asserted.

Conversely, if the limit defined by the capacity of the charge pump has been reached the global enabling signal EN is de-asserted; as a consequence, no further subset of program loads $ST_j$ is enabled.

The same operations described above are continually repeated at every clock signal.

In the meanwhile, the global enabling signal EN goes through the shift register 220. The global disabling signal DIS is then asserted after the corresponding delay from the (first) assertion of the global enabling signal EN. The global disabling signal DIS is supplied to the input terminals DI of the first blocks $B_0$–$B_7$ in all the channels. For each channel, if the first block is associated with a program load that has been enabled (signal at the input terminal PI asserted) the signal at the output terminal CO is de-asserted (so as to disable the corresponding program load), while the signal at the output terminal DO remains de-asserted. On the contrary, the signal at the output terminal DO is asserted (so as to pass the global disabling signal DIS to the next corresponding block), while the signal at the output terminal CO remains de-asserted. The same operations described above are executed until a block associated with an enabled program load is reached.

Likewise, the global disabling signal DIS is asserted again after the same delay from the next assertion of the global enabling signal EN. For each channel, the global disabling signal DIS goes through all the blocks that are associated with either a memory cell not to be programmed or a program load already disabled (until a block associated with a program load still enabled is reached); when the global disabling signal crosses the whole channel, the signal at the corresponding input terminal of the AND gate 315 is asserted.

As soon as all the program loads $PL_i$ associated with the memory cells to be programmed have been enabled, the global enabling signal EN crosses all the channels; therefore, the signal STOP is asserted. In response thereto, the loop controller 205 is disabled. After the delay defined by the shift register 220 also the global disabling signal DIS will cross all the channels. As a consequence, the signal END is asserted as well.

However, the concepts of the present invention are also applicable when the logic blocks are arranged in another way, when the logic blocks have a different structure, or when the latches are replaced with equivalent means. Similar considerations apply if the control signals for the latches are generated in another way, if different components are used for signaling the completion of the program step, and the like.

More generally, the present invention proposes a circuit for programming a non-volatile memory device (having a plurality of memory cells). The circuit includes multiple driving elements, each one used to apply a program pulse to a selected memory cell to be programmed; the driving elements are suitable to be supplied by a power supply unit. Control means is provided for controlling the driving elements. In the circuit of the invention, the control means includes means for determining a residual capacity of the power supply unit; selecting means is used for selectively enabling the driving elements according to the residual capacity.

The solution of the invention strongly reduces the time required for programming the selected memory cells.

The proposed architecture self-adapts to the actual capacity of the power supply unit. In other words, the devised structure makes it possible to exploit the capacity of the power supply unit that is available but unused in the memory devices known in the art.

Therefore, more memory cells may be programmed concurrently at any time, never exceeding the capacity of the power supply unit. This solution strongly improves the speed of the program step without requiring either the capacity of the power supply unit to be increased or the current absorbed by the memory cells to be reduced.

The preferred embodiment of the invention described above offers further advantages.

Particularly, the program loads are enabled in succession during a program step; each program load is disabled after a delay corresponding to the program pulse. The program step is completed as soon as all the program loads have been disabled.

In this way, operation of the program loads is out of phase; therefore, as soon as one or more program loads are disabled, the load of the charge pump is reduced allowing the enabling of other program loads.

Advantageously, the program loads are grouped into subsets that are enabled individually.

This structure is very simple, but at the same time effective.

However, the solution according to the present invention leads itself to be implemented managing the completion of the program step in another way, enabling as many program loads as possible only at the beginning of the program step (for example, according to the residual capacity of the charge pump detected periodically), or even enabling the program loads individually.

In a particular embodiment of the invention, the subsets of program loads are enabled in succession.

This structure is very simple, even if it is not optimal (since it does not enable the maximum number of program loads actually supported by the capacity of the charge pump).

A way to improve the structure is to enable a predetermined number of subsets at the beginning of the program step.

The proposed feature makes it possible to save the time required for reaching the maximum capacity of the charge pump.

Advantageously, each subset of program loads is disabled after a predetermined delay.

This feature ensures the correct operation of the circuit in a very simple manner.

Alternatively, the subsets of program loads are enabled with different algorithms, only a single subset is enabled at every time, or the program loads are disabled in another way.

In a different embodiment of the invention, the program loads to be enabled are selected only among the ones associated with the memory cells actually to be programmed.

In this way, the capacity of the charge pump is used at its best.

As a further enhancement, this result is achieved by means of a matrix of logic blocks arranged in multiple channels; each channel exploits the global enabling signal as a token.

The proposed implementation is simple and modular.

Advantageously, the same structure is also used for disabling the program loads.

In this way, the correct operation of the circuit is achieved with a very compact structure.

However, the solution of the present invention is also suitable to be implemented selecting the program loads to be enabled only according to the residual capacity of the charge pump, exploiting a different structure for managing the program loads, or even disabling the program loads in another way.

Naturally, in order to satisfy local and specific requirements, a person skilled in the art may apply to the solution described above many modifications and alterations all of which, however, are included within the scope of protection of the invention as defined by the following claims.

The present invention is not limited to the examples described above. Many alternative embodiments are possible without departing from the scope defined by the appended claims. For example, it should be obvious to those of ordinary skill in the art in view of the present discussion that alternative embodiments of the new and novel circuit may be implemented in an integrated circuit comprising a circuit supporting substrate that supports at least a portion of the new and novel circuit discussed above. Additionally, the new and novel method and circuit may be implemented in a computer system comprising at least one such integrated circuit thereby providing the advantages of the present invention to such computer system.

While there has been illustrated and described what are presently considered to be the preferred embodiments of the present invention, it will be understood by those of ordinary skill in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A circuit for programming a non-volatile memory device having a plurality of memory cells, the circuit including a plurality of driving elements each one for applying a program pulse to a selected memory cell to be programmed, the plurality of driving elements being suitable to be supplied by a power supply unit, and control means for controlling the plurality of driving elements, wherein
   the control means includes
      means for determining a residual capacity of the power supply unit, and
      selecting means for selectively enabling the plurality of driving elements according to the residual capacity of the power supply unit for supplying the programming of the plurality of memory cells.

2. The circuit according to claim 1, wherein the selecting means enables at least one driving element in succession during a program step of the selected memory cells, the selecting means further including means for disabling each driving element after a predetermined delay from the enabling of the driving element, the delay corresponding to the length of the program pulse, and wherein the control means further includes means for signaling a completion of the program step when all of the driving elements of the enabled at least one driving element have been disabled.

3. The circuit according to claim 2, wherein the driving elements are grouped into a plurality of subsets each one consisting of a predetermined number of driving elements, the selecting means including means for providing an enabling signal when the power supply unit is in a condition to supply the driving elements of a further subset.

4. The circuit according to claim 3, wherein the selecting means further includes means responsive to the enabling signal for individually enabling the subsets in succession.

5. The circuit according to claim 3, wherein the selecting means further includes means responsive to a first enabling signal at the beginning of the program step for enabling a predetermined plurality of subsets, and means responsive to each next enabling signal for individually enabling the remaining subsets in succession.

6. The circuit according to claim 4, wherein the selecting means further includes means for providing a disabling signal after the predetermined delay from the provision of the enabling signal, means responsive to the disabling signal for disabling the subset enabled by the corresponding enabling signal, and means for providing a signal indicative of the completion of the program step in response to the disabling signal corresponding to a last one of the subsets.

7. The circuit according to claim 1, wherein the driving elements are grouped into a plurality of subsets each one consisting of a predetermined number of driving elements, the selecting means including means for providing an enabling signal when the power supply unit is in a condition to supply the driving elements of a further subset.

8. The circuit according to claim 7, wherein the selecting means further includes means responsive to the enabling signal for individually enabling the subsets in succession.

9. The circuit according to claim 7, wherein the selecting means further includes means responsive to a first enabling signal at the beginning of the program step for enabling a predetermined plurality of subsets, and means responsive to each next enabling signal for individually enabling the remaining subsets in succession.

10. The circuit according to claim 8, wherein the selecting means further includes means for providing a disabling signal after the predetermined delay from the provision of the enabling signal, means responsive to the disabling signal for disabling the subset enabled by the corresponding enabling signal, and means for providing a signal indicative of the completion of the program step in response to the disabling signal corresponding to a last one of the subsets.

11. The circuit according to claim 7, wherein the selecting means further includes means responsive to the enabling signal for enabling at most the predetermined number of driving elements selected only among the driving elements associated with memory cells to be programmed.

12. The circuit according to claim 11, wherein the selecting means includes a logic block for each driving element, the logic blocks being grouped into a plurality of further subsets corresponding to the subsets of the driving elements, each logic block including means for storing an indication of whether the corresponding driving element has been enabled, means for enabling the corresponding driving element in response to the enabling signal when the corresponding memory cell is to be programmed and the corresponding driving element has not been enabled, and means for transmitting the enabling signal to a corresponding logic block of a next further subset otherwise.

13. The circuit according to claim 12, wherein the selecting means further includes means for providing a disabling signal after the predetermined delay from the provision of the enabling signal, each logic block further including means for storing an indication of whether the corresponding driving element has been disabled, means for disabling the corresponding driving element in response to the disabling signal when the corresponding memory cell is to be programmed and the corresponding driving element has not been disabled, and means for transmitting the disabling signal to the corresponding logic block of the next further subset otherwise, and wherein the selecting means further includes means for providing a signal indicative of the completion of the program step in response to the disabling signal transmitted by all the logic blocks of a last further subset.

14. A non-volatile memory device comprises:
a plurality of memory cells; and
a circuit, electrically coupled to the plurality of memory cells, for programming the memory cells of the non-volatile memory device, the circuit including a plurality of driving elements each one for applying a program pulse to a selected memory cell of the plurality of memory cells for programming the selected memory cell, the plurality of driving elements being suitable to be supplied by a power supply unit, and control means for controlling the plurality of driving elements, wherein
the control means includes
means for determining a residual capacity of the power supply unit, and
selecting means for selectively enabling the pluraltiy of driving elements according to the residual capacity of the power supply unit for supplying the programming of the plurality of memery cells.

15. The non-volatile memory device according to claim 14, wherein the driving elements are grouped into a plurality of subsets each one consisting of a predetermined number of driving elements, the selecting means including means for providing an enabling signal when the power supply unit is in a condition to supply the driving elements of a further subset.

16. The non-volatile memory device according to claim 15, wherein the selecting means further includes means responsive to the enabling signal for individually enabling the subsets in succession.

17. The non-volatile memory device according to claim 14, wherein the selecting means enables at least one driving element in succession during a program step of the selected memory cells, the selecting means further including means for disabling each driving element after a predetermined delay from the enabling of the driving element, the delay corresponding to the length of the program pulse, and wherein the control means further includes means for signaling a completion of the program step when all driving elements of the enabled at least one driving element have been disabled.

18. The circuit according to claim 17, wherein the driving elements are grouped into a plurality of subsets each one consisting of a predetermined number of driving elements, the selecting means including means for providing an enabling signal when the power supply unit is in a condition to supply the driving elements of a further subset.

19. A method of programming a non-volatile memory device including a plurality of memory cells and a plurality of driving elements each one for applying a program pulse to a selected memory cell to be programmed, the method including the steps of:
supplying the plurality of driving elements by a power supply unit,
determining a residual capacity of the power supply unit; and
selectively enabling the plurality of driving elements according to the residual capacity of the power supply unit for supplying the programming of the plurality of memery cells.

20. The method of claim 19, wherein the driving elements are grouped into a plurality of subsets each one consisting of a predetermined number of driving elements, the method further comprising:
providing an enabling signal when the power supply unit is in a condition to supply the driving elements of a further subset.

21. The method of claim 20, further comprising:
in response to the enabling signal, individually enabling the subsets in succession.

22. The method of claim 19, wherein the selectively enabling step enables at least one driving element in succession during a program step of at least one selected memory cell, and further comprising the steps of:
disabling each driving element of the at least one driving element after a predetermined delay from the enabling of the respective driving element, the delay corresponding to the length of a program pulse, and
signaling a completion of a program step when all driving elements of the enabled at least one driving element have been disabled.

23. An integrated circuit comprising:
a circuit supporting substrate;
a plurality of memory cells; and
a circuit, at least a portion being disposed on the circuit supporting substrate and being electrically coupled to the plurality of memory cells, for programming the memory cells, the circuit including a plurality of driving elements each one for applying a program pulse to a selected memory cell of the plurality of memory cells for programming the selected memory cell, the plurality of driving elements being suitable to be supplied by a power supply unit, and control means for controlling the plurality of driving elements, wherein
the control means includes
means for determining a residual capacity of the power supply unit, and
selecting means for selectively enabling the plurality of driving elements according to the residual capacity of the power supply unit for supplying the programming of the plurality of memery cells.

24. A computer system comprising:
a plurality of integrated circuits, each comprising:
a circuit supporting substrate;
a plurality of memory cells; and
a circuit, at least a portion being disposed on the circuit supporting substrate and being electrically coupled to the plurality of memory cells, for programming the memory cells, the circuit including a plurality of driving elements each one for applying a program pulse to a selected memory cell of the plurality of memory cells for programming the selected memory cell, the plurality of driving elements being suitable to be supplied by a power supply unit, and control means for controlling the plurality of driving elements, wherein the control means includes means for determining a residual capacity of the power supply unit, and selecting means for selectively enabling the plurality of driving elements according to the residual capacity of the power supply unit for supplying the programming of the plurality of memery cells.

* * * * *